(12) United States Patent
Yota et al.

(10) Patent No.: US 11,387,193 B2
(45) Date of Patent: *Jul. 12, 2022

(54) METHOD OF MAKING MOISTURE BARRIER FOR BOND PADS AND INTEGRATED CIRCUIT HAVING THE SAME

(71) Applicant: Skyworks Solutions, Inc., Irvine, CA (US)

(72) Inventors: Jiro Yota, Westlake Village, CA (US); Shiban Kishan Tiku, Camarillo, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/138,227

(22) Filed: Dec. 30, 2020

(65) Prior Publication Data

US 2021/0118820 A1    Apr. 22, 2021

Related U.S. Application Data

(63) Continuation of application No. 16/992,405, filed on Aug. 13, 2020, now Pat. No. 11,222,855.

(60) Provisional application No. 62/896,282, filed on Sep. 5, 2019.

(51) Int. Cl.
*H01L 23/00* (2006.01)
*H01L 23/66* (2006.01)

(52) U.S. Cl.
CPC ............ *H01L 23/564* (2013.01); *H01L 23/66* (2013.01); *H01L 24/05* (2013.01); *H01L 2223/6677* (2013.01); *H01L 2224/05557* (2013.01)

(58) Field of Classification Search
CPC ............ H01L 27/3241; H01L 27/3244; H01L 27/3258; H01L 27/3276
See application file for complete search history.

(56) References Cited

U.S. PATENT DOCUMENTS

| 6,376,769 B1 | 4/2002 | Chung |
| 9,362,111 B2 | 6/2016 | Wang et al. |
| 2009/0206486 A1* | 8/2009 | Lin .................... H01L 21/76885 257/759 |

(Continued)

FOREIGN PATENT DOCUMENTS

| JP | 4449426 B2 | 4/2010 |
| JP | 4625911 B2 | 2/2011 |
| KR | 19980064117 A | 10/1998 |

*Primary Examiner* — Mamadou L Diallo
(74) *Attorney, Agent, or Firm* — Knobbe, Martens, Olson & Bear LLP

(57) ABSTRACT

A semiconductor die includes a substrate layer, one or more metal layers disposed over the substrate layer, and a pair of polyimide layers disposed over the substrate so that they define an interface therebetween. One or both of the pair of polyimide layers have a trench that separates the interface from the one or more metal layers. The trench can be formed by etching the polyimide layer(s). A topcoat insulation layer is disposed over the one or more metal layers and polyimide layers. The topcoat insulation layer is impervious to moisture and the trench inhibits migration of moisture along the interface to the one or more metal layers, thereby preventing metal migration from the one or more metal layers along the interface.

20 Claims, 14 Drawing Sheets

(56) References Cited

U.S. PATENT DOCUMENTS

| | | | |
|---|---|---|---|
| 2012/0235175 A1* | 9/2012 | Prushinskiy | H01L 51/5281 |
| | | | 257/88 |
| 2015/0255410 A1* | 9/2015 | Filippi | H01L 24/13 |
| | | | 257/774 |
| 2016/0064811 A1 | 3/2016 | Yota et al. | |
| 2016/0284639 A1* | 9/2016 | Chen | H01L 23/5329 |
| 2019/0229028 A1* | 7/2019 | Mohammed | H01L 24/05 |
| 2021/0020587 A1* | 1/2021 | Yota | H01L 23/66 |
| 2021/0098399 A1* | 4/2021 | Huang | H01L 24/05 |
| 2021/0118821 A1 | 4/2021 | Yota et al. | |
| 2021/0143790 A1* | 5/2021 | Steinhaeusser | H03H 3/08 |
| 2021/0233878 A1* | 7/2021 | Shindo | H01L 21/78 |

\* cited by examiner

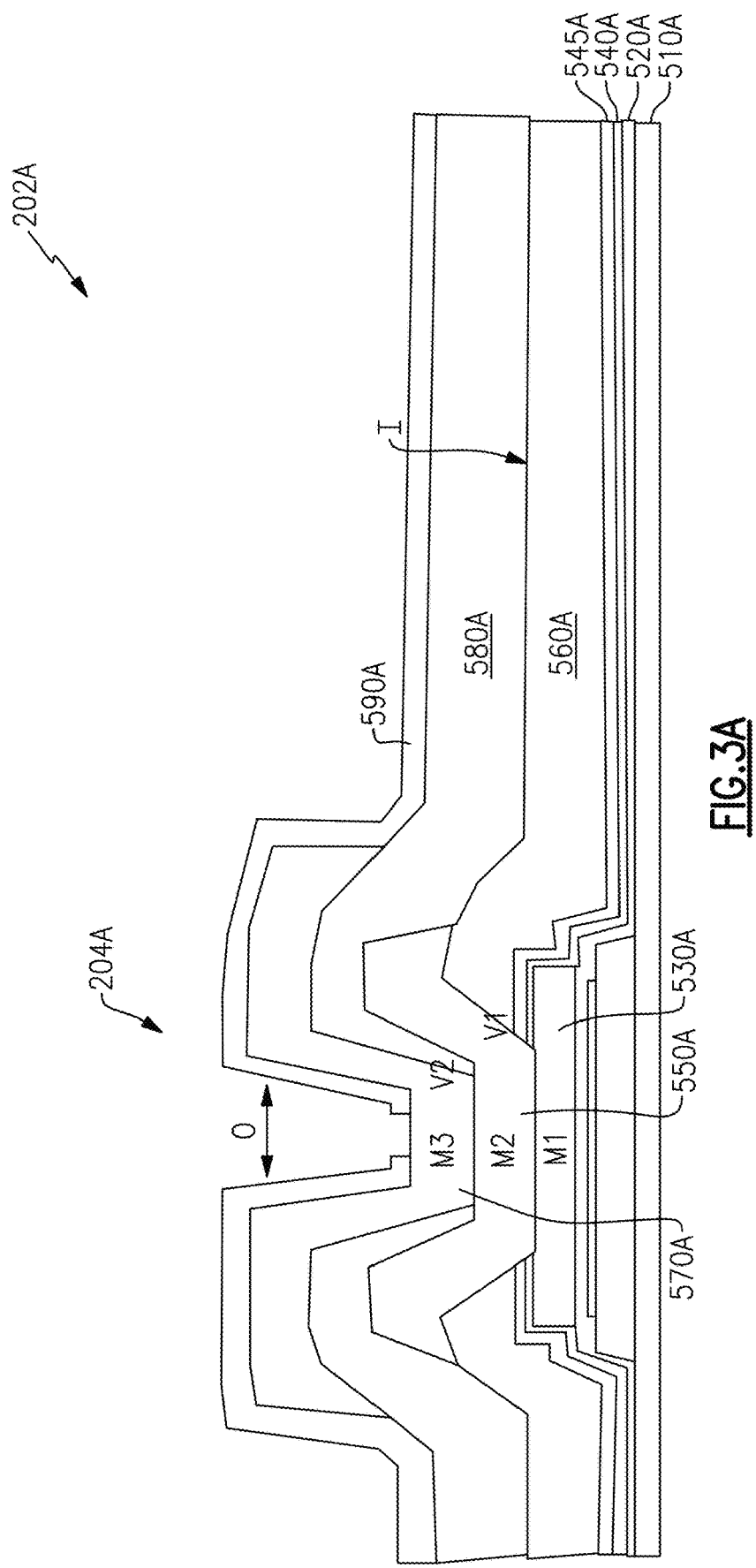

METHOD OF MAKING MOISTURE BARRIER FOR BOND PADS AND INTEGRATED CIRCUIT HAVING THE SAME

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

The present disclosure is directed to a moisture barrier for use between bond pads and other components in an integrated circuit, and more particularly to a moisture barrier for use between bond pads and other components in integrated circuits that use a polyimide interlayer insulator.

Description of the Related Art

Some semiconductor integrated circuits (ICs) use polyimide as an interlayer insulator. However, during operation under ambient conditions, as well as during high accelerated stress testing (HAST) test conditions (high temperature, high pressure, high moisture conditions), polyimide acts as a wick to draw moisture from outside and transport it to sensitive elements on the ICs, such as bond pads that are used for high voltage and are near die edges or close to other components that are low voltage. In the presence of moisture, metal migration between bond pads and other components (e.g., other bond pads, capacitors) has been seen to cause a short circuit (e.g., in products that use gold-based metallization and polyimide based isolation between metal layers). Such moisture primarily travels along an interface between adjacent polyimide layers.

SUMMARY

Accordingly, there is a need for an improved manner to avoid moisture exposure to bond pads that can cause metal migration between the bond pads or between a bond pad and another component (e.g., a capacitor), that can lead to a short circuit, such as in semiconductor integrated circuits that use polyimide as an interlayer insulator.

In accordance with one aspect of the invention, a packaged module is provided with a moat (e.g., a no polyimide zone) proximate that provides a moisture barrier. In one implementation, the moat is provided around one or more bond pads (e.g., provided around each bond pad).

In accordance with one aspect of the disclosure, a semiconductor die is provided. The semiconductor die comprises a substrate layer and one or more metal layers disposed over the substrate layer. The semiconductor die also comprises a first polymer interlevel dielectric layer and a second polymer interlevel dielectric layer disposed over the substrate, at least one of the first and second polymer interlevel dielectric layers spaced from (e.g., laterally spaced from) the one or more metal layers by a trench so that an interface between the first and second polymer interlevel dielectric layers is spaced apart from the one or more metal layers. The semiconductor die also comprises a topcoat insulation layer disposed over the one or more metal layers and one or more polymer interlevel dielectric layers. The top coat insulation layer is impervious to moisture and the trench inhibits migration of moisture along the interface to the one or more metal layers, thereby preventing metal migration from the one or more metal layers along the interface.

In accordance with another aspect of the disclosure, a radiofrequency module is provided. The radiofrequency module comprises a printed circuit board. The radiofrequency module also comprises a semiconductor die mounted on the printed circuit board. The semiconductor die comprises a substrate layer and one or more metal layers disposed over the substrate layer. The semiconductor die also comprises a first polymer interlevel dielectric layer and a second polymer interlevel dielectric layer disposed over the substrate, at least one of the first and second polymer interlevel dielectric layers spaced from (e.g., laterally spaced from) the one or more metal layers by a trench so that an interface between the first and second polymer interlevel dielectric layers is spaced apart from the one or more metal layers. The semiconductor die also comprises a topcoat insulation layer disposed over the one or more metal layers and one or more polymer interlevel dielectric layers. The top coat insulation layer is impervious to moisture and the trench inhibits migration of moisture along the interface to the one or more metal layers, thereby preventing metal migration from the one or more metal layers along the interface.

In accordance with another aspect of the disclosure, a wireless mobile device is provided. The wireless mobile device comprises one or more antennas, a front end system that communicates with the one or more antennas, and a semiconductor die. The semiconductor die comprises a substrate layer and one or more metal layers disposed over the substrate layer. The semiconductor die also comprises a first polymer interlevel dielectric layer and a second polymer interlevel dielectric layer disposed over the substrate, at least one of the first and second polymer interlevel dielectric layers spaced from (e.g., laterally spaced from) the one or more metal layers by a trench so that an interface between the first and second polymer interlevel dielectric layers is spaced apart from the one or more metal layers. The semiconductor die also comprises a topcoat insulation layer disposed over the one or more metal layers and one or more polymer interlevel dielectric layers. The top coat insulation layer is impervious to moisture and the trench inhibits migration of moisture along the interface to the one or more metal layers, thereby preventing metal migration from the one or more metal layers along the interface.

In accordance with another aspect of the disclosure, a method of making a semiconductor die is provided. The method comprises forming or providing a substrate layer, and forming or applying one or more metal layers over the substrate layer. The method also comprises forming or applying a first polymer interlevel dielectric layer over the substrate layer and forming or applying a second polymer interlevel dielectric layer over the first polymer interlevel dielectric layer to define an interface therebetween. At least a portion of the first and second polymer interlevel dielectric layers are adjacent at least one of the one or more metal layers. The method also comprises forming a trench in the one or both of the first and second polymer interlevel dielectric layers and filling the trench such that the interface between the first and second polymer interlevel dielectric layers is separated from (e.g., laterally separated from) the one or more metal layers. The method also comprises forming or applying a topcoat insulation layer over the one or more metal layers and first and second polymer interlevel dielectric layers, the topcoat insulation layer being impervious to moisture. The trench inhibits migration of moisture along the interface to the one or more metal layers, thereby preventing metal migration from the one or more metal layers along the interface.

In accordance with another aspect of the disclosure, a method of making a radiofrequency module is provided. The method comprises forming or providing a printed circuit board that includes a substrate layer. The method also comprises forming or providing a semiconductor die. Forming or providing the semiconductor die comprises forming or providing a substrate layer, and forming or applying one or more metal layers over the substrate layer. Forming or providing the semiconductor die also comprises forming or applying a first polymer interlevel dielectric layer over the substrate layer and forming or applying a second polymer interlevel dielectric layer over the first polymer interlevel dielectric layer to define an interface therebetween. At least a portion of the first and second polymer interlevel dielectric layers are adjacent at least one of the one or more metal layers. Forming or providing the semiconductor die also comprises forming a trench in the one or both of the first and second polymer interlevel dielectric layers and filling the trench such that the interface between the first and second polymer interlevel dielectric layers is separated from (e.g., laterally separated from) the one or more metal layers. Forming or providing the semiconductor die also comprises forming or applying a topcoat insulation layer over the one or more metal layers and first and second polymer interlevel dielectric layers, the topcoat insulation layer being impervious to moisture. The trench inhibits migration of moisture along the interface to the one or more metal layers, thereby preventing metal migration from the one or more metal layers along the interface. The method also comprises mounting the semiconductor die on the printed circuit board.

BRIEF DESCRIPTION OF THE DRAWINGS

FIG. 3A is a schematic cross-sectional side view of a conventional die with a bond pad.

DETAILED DESCRIPTION

Figure 1:
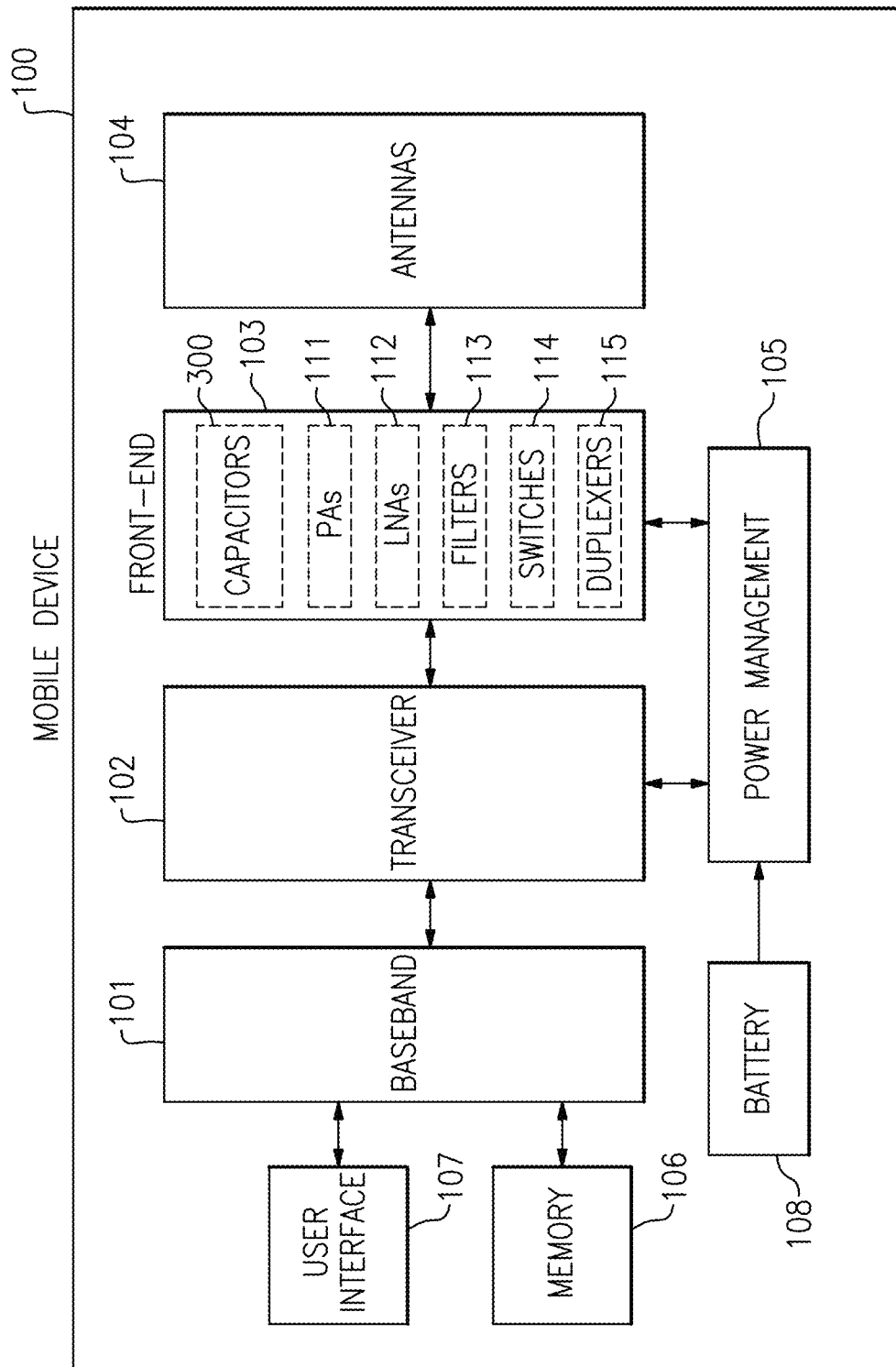
FIG. 1 is a schematic diagram of one embodiment of a wireless device.

The following detailed description of certain embodiments presents various descriptions of specific embodiments. However, the innovations described herein can be embodied in a multitude of different ways, for example, as defined and covered by the claims. In this description, reference is made to the drawings were like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet-of-Things (NB-IOT), Vehicle-to-Everything (V2X), and High Power User Equipment (HPUE).

3GPP introduced Phase 1 of fifth generation (5G) technology in Release 15 and plans to introduce Phase 2 of 5G technology in Release 16 (targeted for 2019). Subsequent 3GPP releases will further evolve and expand 5G technology. 5G technology is also referred to herein as 5G New Radio (NR).

5G NR supports or plans to support a variety of features, such as communications over millimeter wave spectrum, beam forming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, analog devices, radiofrequency devices, and communication systems using advanced cellular technologies, such as LTE-Advanced, LTE-Advanced Pro, and/or 5G NR.

FIG. 1 is a schematic diagram of one embodiment of a wireless device 100. The wireless device 100 can be, for example but not limited to, a portable telecommunication device such as a mobile cellular-type telephone. The wireless device 100 can include one or more of a baseband system 101, a transceiver 102, a front end system 103, one or more antennas 104, a power management system 105, a memory 106, a user interface 107, a battery 108 (e.g., direct current (DC) battery). Other additional components, such as a speaker, display and keyboard can optionally be connected to the baseband system 101. The battery 108 can provide power to the wireless device 100.

It should be noted that, for simplicity, only certain components of the wireless device 100 are illustrated herein. The control signals provided by the baseband system 101 control the various components within the wireless device 100. Further, the function of the transceiver 102 can be integrated into separate transmitter and receiver components.

The wireless device 100 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 102 generates RF signals for transmission and processes incoming RF signals received from the antennas 104. It will be understood that various functionalities associated with the transmission and receiving of RF signals can be achieved by one or more components that are collectively represented in FIG. 1 as the transceiver 102. In one example, separate components (for instance, separate circuits or dies) can be provided for handling certain types of RF signals.

The front end system 103 aids in conditioning signals transmitted to and/or received from the antennas 104. In the illustrated embodiment, the front end system 103 includes one or more power amplifiers (PAs) 111, low noise amplifiers (LNAs) 112, filters 113, switches 114, duplexers 115 and capacitors 300. However, other implementations are possible.

For example, the front end system 103 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the wireless device 100 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 104 can include antennas used for a wide variety of types of communications. For example, the antennas 104 can include antennas for transmitting and/or receiving signals associated with a wide variety of frequencies and communications standards.

In certain implementations, the antennas 104 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The wireless device 100 can operate with beamforming in certain implementations. For example, the front end system 103 can include phase shifters having variable phase controlled by the transceiver 102. Additionally, the phase shifters are controlled to provide beam formation and directivity for transmission and/or reception of signals using the antennas 104. For example, in the context of signal transmission, the phases of the transmit signals provided to the antennas 104 are controlled such that radiated signals from the antennas 104 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 104 from a particular direction. In certain implementations, the antennas 104 include one or more arrays of antenna elements to enhance beamforming.

The baseband system 101 is coupled to the user interface 107 to facilitate processing of various user input and output (I/O), such as voice and data. The baseband system 101 provides the transceiver 102 with digital representations of transmit signals, which the transceiver 102 processes to generate RF signals for transmission. The baseband system 101 also processes digital representations of received signals provided by the transceiver 102. As shown in FIG. 1, the baseband system 101 is coupled to the memory 106 of facilitate operation of the wireless device 100.

The memory 106 can be used for a wide variety of purposes, such as storing data and/or instructions to facilitate the operation of the wireless device 100 and/or to provide storage of user information.

The power management system 105 provides a number of power management functions of the wireless device 100. In certain implementations, the power management system 105 includes a PA supply control circuit that controls the supply voltages of the power amplifiers 111. For example, the power management system 105 can be configured to change the supply voltage(s) provided to one or more of the power amplifiers 111 to improve efficiency, such as power added efficiency (PAE).

As shown in FIG. 1, the power management system 105 receives a battery voltage from the battery 108. The battery 108 can be any suitable battery for use in the wireless device 100, including, for example, a lithium-ion battery.

Figure 2A:
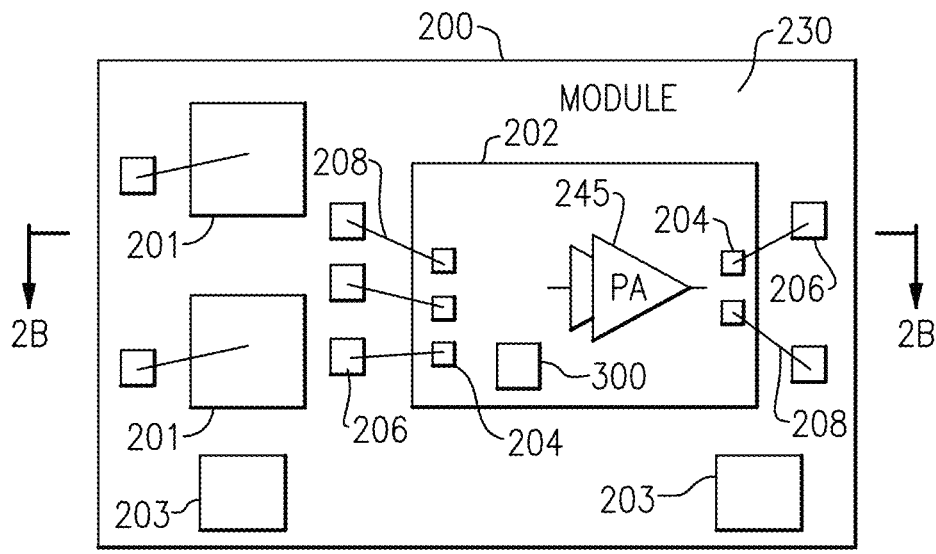
FIG. 2A is a schematic diagram of one embodiment of a packaged module.
Figure 2B:
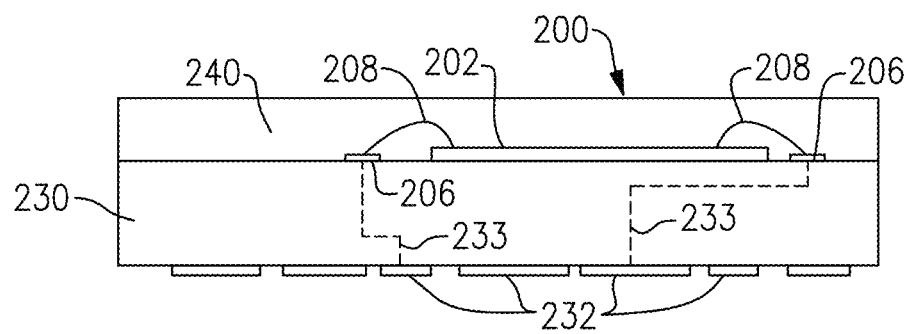
FIG. 2B is a schematic diagram of a cross-section of the packaged module of FIG. 2A taken along the lines 2B-2B.

FIG. 2A is a schematic diagram of one embodiment of a packaged module 200. FIG. 2B is a schematic diagram of a cross-section of the packaged module 200 of FIG. 2A taken along the lines 2B-2B.

The packaged module 200 includes radio frequency components 201, a semiconductor die 202, surface mount devices 203, wirebonds 208, a package substrate 230, an encapsulation structure 240, and one or more capacitors 300. The package substrate 230 includes pads (e.g., bond pads) 206 formed from conductors disposed therein. Additionally, the semiconductor die 202 includes pins or pads (e.g., bond pads) 204, and the wirebonds 208 have been used to connect the pads (e.g., bond pads) 204 of the die 202 to the pads (e.g., bond pads) 206 of the package substrate 220.

The semiconductor die 202 includes a power amplifier 245, which can be implemented in accordance with one or more features disclosed herein.

The packaging substrate 230 can be configured to receive a plurality of components such as radio frequency components 201, the semiconductor die 202 and the surface mount devices 203, which can include, for example, surface mount capacitors and/or inductors. In one implementation, the radio frequency components 201 include integrated passive devices (IPDs).

As shown in FIG. 2B, the packaged module 200 is shown to include a plurality of contact pads 232 disposed on the side of the packaged module 200 opposite the side used to mount the semiconductor die 202. Configuring the packaged module 200 in this manner can aid in connecting the packaged module 200 to a circuit board, such as a phone board of a mobile device. The example contact pads 232 can be configured to provide radio frequency signals, bias signals, and/or power (for example, a power supply voltage and ground) to the semiconductor die 202 and/or other components. As shown in FIG. 2B, the electrical connections between the contact pads 232 and the semiconductor die 202 can be facilitated by connections 233 through the package substrate 230. The connections 233 can represent electrical paths formed through the package substrate 220, such as connections associated with vias and conductors of a multilayer laminated package substrate.

In some embodiments, the packaged module 200 can also include one or more packaging structures to, for example, provide protection and/or facilitate handling. Such a packaging structure can include overmold or encapsulation structure 240 formed over the packaging substrate 230 and the components and die(s) disposed thereon.

It will be understood that although the packaged module 200 is described in the context of electrical connections based on wirebonds, one or more features of the present disclosure can also be implemented in other packaging configurations, including, for example, flip-chip configurations.

FIG. 3A schematically illustrates a conventional die 202A with a bond pad 204A. The die 202A includes a substrate layer 510A. Optionally, the substrate layer 510A can be made of gallium arsenide (GaAs). One or more insulation layers 520A are disposed over (e.g., directly over, adjacent) the substrate layer 510A. Optionally, the insulation layer 520A can be made of silicon nitride (SiN).

A first metal layer 530A (M1) can be disposed over (e.g., directly over, adjacent) at least a portion of the insulation layer 520A. The first metal layer 530A can define a first electrode portion of the bond pad 204A and extend along a length smaller than a length of the insulation layer 520A. A second insulation layer 540A can be disposed over (e.g., directly over, adjacent) the first metal layer 530A and disposed over the insulation layer 520A. The second insulation layer 540A can optionally be made of silicon nitride. A third insulation layer 545A can be disposed over (e.g., directly over, adjacent) the second insulation layer 540A. The third insulation layer 545A can optionally be made of silicon nitride.

A second metal layer 550A (M2) can be disposed over at least a portion of (e.g., less than an entire length of) the second insulation layer 540A and third insulation layer 545A. The second metal layer 550A can define a second electrode portion of the bond pad 204A and contact at least a portion of the first metal layer 530A (M1). The second metal layer 550A can be longer than the first metal layer 530A. A first interlayer insulator layer 570A (V1) is disposed over (e.g., directly over, adjacent) the third insulation layer 545A and extend under at least a portion of the second metal layer 550A (M2). The first interlayer insulator layer 560A can be made of polyimide. However, the first interlayer insulator layer 560A can be made of other suitable polymer materials.

A third metal layer 570A (M3) can be disposed over (e.g., directly over, adjacent) at least a portion of the second metal layer 550A. The third metal layer 570A can extend along a length greater than the length of the second metal layer 550A. A second interlayer insulator layer 580A (V2) can be disposed over (e.g., directly over, adjacent) the first interlayer insulator layer 560A, and extend in between at least a portion of the second metal layer 550A and third metal layer 570A. The second interlayer insulator layer 580A can be made of polyimide. However, the second interlayer insulator layer 580A can be made of other suitable polymer materials. A topcoat insulation layer (or fourth insulation layer) 590A can be disposed over (e.g. directly over, adjacent) at least a portion of the second interlayer insulator layer 580A and at last a portion of the third metal layer 570A. The topcoat insulation layer 590A can optionally be made of silicon nitride, and is impervious to moisture, thereby providing a moisture barrier. The bond pad 204A can be defined by at least a portion of one or more of the first, second and third metal layers 530A, 550A, 570A.

Figure 3B:
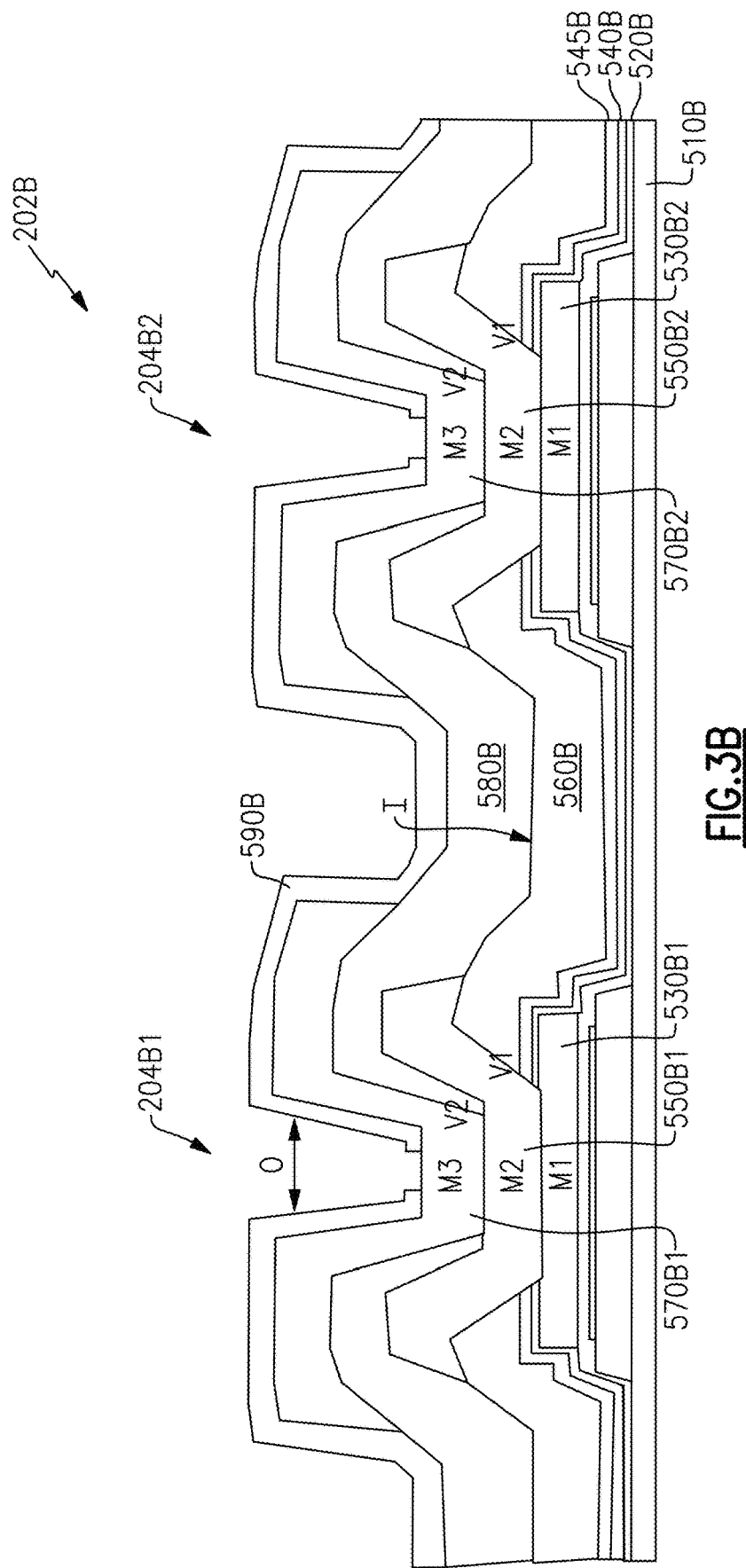
FIG. 3B is a schematic cross-sectional side view of a conventional die with a pair of bond pads.

FIG. 3B schematically illustrates a conventional die 202B with a first bond pad 204B1 and a second bond pad 204B1. The features of the die 202B are similar to the features of the die 202A, and the features of the bond pads 204B1, 204B2 are similar to the features of the bond pad 204A in FIG. 3A. Thus, reference numerals used to designate the various components of the die 202B and bond pads 204B1, 204B2 are similar to those used for identifying the corresponding components of the die 202A and bond pad 204A in FIG. 3A, except that a "B" instead of an "A" has been added to the numerical identifier. Therefore, the structure and description for the various features of the die 202A and bond pad 204A in FIG. 3A are understood to also apply to the corresponding features of the die 202B and bond pads 204B1, 204B2, except as described below.

The die 202B differs from the die 202A in that it includes two bond pads 204B1, 204B2 instead of one bond pad 204A. The first and second interlayer insulation layers 560B, 580B, like the first and second interlayer insulation layers 560A, 580A, define an interface or junction I into which moisture can migrate (e.g., from defects on a top portion or edges of the die 202A, 202B, from flaws in the bond pads 204A, 204B). The presence of moisture in the interface I in the presence of an electric voltage (via the bond pads 204A, 204B) can cause migration of metal (e.g., gold) along the interface I from one bond pad 204B1 to another bond pad 204B2 (or to another component of the die 202B), causing a short circuit.

Moisture Barrier

Figure 4:
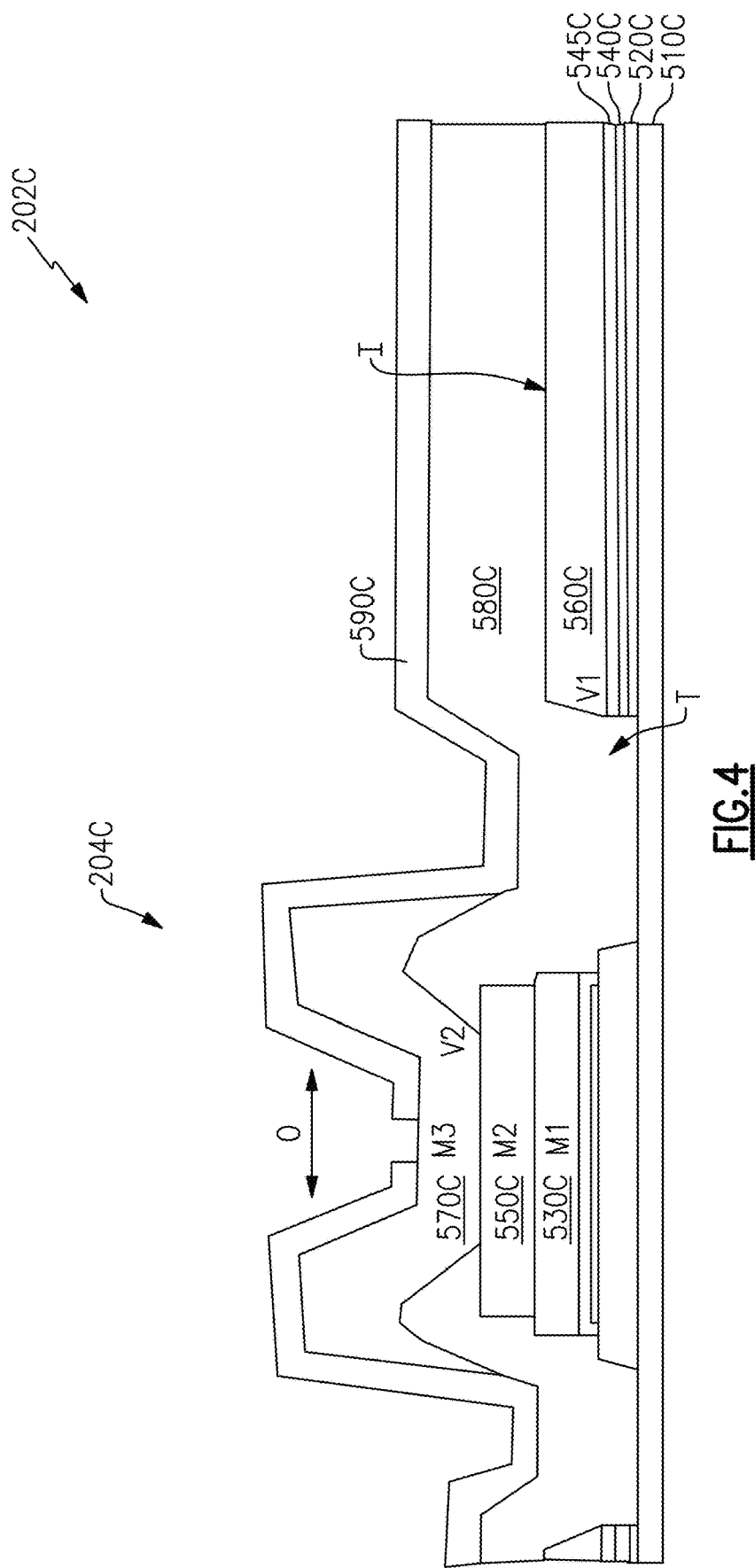
FIG. 4 is a schematic cross-sectional side view of a die having a bond pad with a moisture barrier.

FIG. 4 schematically illustrates a die 202C with a bond pad 204C. The features of the die 202C are similar to the features of the die 202A, and the features of the bond pad 204C are similar to the features of the bond pad 204A in FIG. 3A. Thus, reference numerals used to designate the various components of the die 202C and bond pad 204C are similar to those used for identifying the corresponding components of the die 202A and bond pad 204A in FIG. 3A, except that a "C" instead of an "A" has been added to the numerical identifier. Therefore, the structure and description for the various features of the die 202A and bond pad 204A in FIG. 3A are understood to also apply to the corresponding features of the die 202C and bond pad 204C, except as described below.

The die 202C includes a substrate layer 510C. Optionally, the substrate layer 510C can be made of gallium arsenide (GaAs). An insulation layer 520C is disposed over (e.g., directly over, adjacent) the substrate layer 510C. Optionally, the insulation layer 520C can be made of silicon nitride (SiN).

A first metal layer 530C (M1) can be disposed over (e.g., directly over, adjacent) at least a portion of the insulation layer 520C. The first metal layer 530C can define a first electrode portion of the bond pad 204C and extend along a length smaller than a length of the insulation layer 520C. A second insulation layer 540C can be disposed over (e.g., directly over, adjacent) at least a portion of the insulation layer 520C. The second insulation layer 540C can optionally be made of silicon nitride.

A second metal layer 550C (M2) can be disposed over at least a portion of (e.g., less than an entire length of) the first metal layer 530C. The second metal layer 550C can define a second electrode portion of the bond pad 204C and optionally extend along a length smaller than a length of the first metal layer 530C. A third insulation layer 545C can be disposed over at least a portion of (e.g., less than an entire length of) the second insulation layer 540C. A first interlayer insulator layer 560C (V1) is disposed over (e.g., directly over, adjacent) the third insulation layer 545C. The first interlayer insulator layer 560C can be made of polyimide. However, the first interlayer insulator layer 560C can be made of other suitable polymer materials. The first insulator layer 560C does not extend to the first and second metal layers 530C, 550C, as further discussed below.

A third metal layer 570C (M3) can be disposed over (e.g., directly over, adjacent) at least a portion of (e.g., less than an entire length of) the second metal layer 550C. The third metal layer 570C can define a third electrode portion of the bond pad 204C and extend along a length greater than the length of the first metal layer 530C and the second metal layer 550C. A second interlayer insulator layer 580C (V2) can be disposed over (e.g., directly over, adjacent) the first interlayer insulator layer 560C, in contact with the first and second metal layers 530C, 550C, and at least partially between the second metal layer 550C and the third metal layer 570C. The second interlayer insulator layer 580C can be made of polyimide. However, the second interlayer insulator layer 580C can be made of other suitable polymer materials. A topcoat insulation layer (or fourth insulation layer) 590C can be disposed over (e.g. directly over, adjacent) the third metal layer 570C and the second interlayer insulator layer 580C. The topcoat insulation layer 590C can optionally be made of silicon nitride, and is impervious to moisture, thereby providing a moisture barrier.

Advantageously, only the second interlayer insulator layer 580C contacts the first, second and third metal layers 530C, 550C, 570C, thereby providing the die 202C with a moisture barrier. The first interlayer insulator layer 560C is etched to define a trench T so that the first interlayer insulator layer 560C terminates before (e.g., approximately 4 microns away from) reaching the metal layers 530C, 550C, 570C and the second interlayer insulator layer 580C fills the trench T left by the portion of the first interlayer insulator layer 560C that is etched away. Accordingly, the interface I between the first and second interlayer insulator layers 560C, 580C does not extend to the first, second or third metal layers 530C, 550C, 570C, thereby preventing moisture migration, as well as metal migration when exposed to a voltage, between the bond pad 204C and other components (e.g., another bond pad, another component of the die) along the interface I. The opening O of the bond pad 204C (e.g., exposed portion of the third metal layer 570C), in one implementation, is approximately 50 microns.

With reference to FIG. 4, the first, second and third insulation layers 520C, 540C, 545C are also etched and filled with the second interlayer insulator layer 580C. In another implementation, only the second and third insulation layers 540C, 545C are etched. In another implementation, only the third insulation layer 545C is etched.

Figure 5:
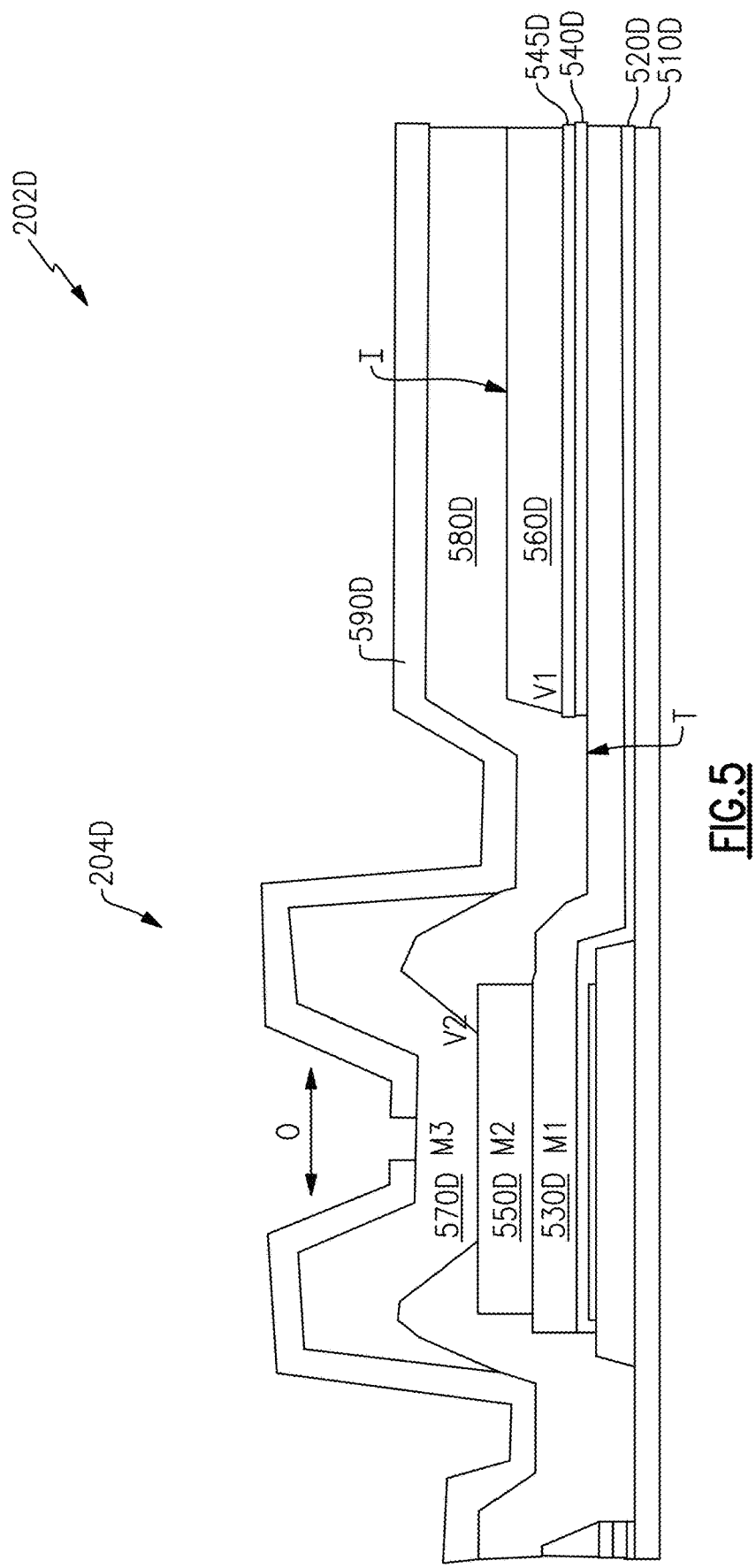
FIG. 5 is a schematic cross-sectional side view of a die having a bond pad with a moisture barrier.

FIG. 5 schematically illustrates a die 202D with a bond pad 204D. The features of the die 202D are similar to the features of the die 202C, and the features of the bond pad 204D are similar to the features of the bond pad 204C in FIG. 4. Thus, reference numerals used to designate the various components of the die 202D and bond pad 204D are similar to those used for identifying the corresponding components of the die 202C and bond pad 204C in FIG. 4, except that a "D" instead of an "C" has been added to the numerical identifier. Therefore, the structure and description for the various features of the die 202C and bond pad 204C in FIG. 4 are understood to also apply to the corresponding features of the die 202D and bond pad 204D, except as described below.

The die 202D and bond pad 204D differ from the die 202C and bond pad 204C in that the first metal layer 530D extends between the first insulation layer 520D and the second insulation layer 540D and across the die 202D, thereby allowing an electrical communication between the bond pad 204D and another component (e.g., bond pad, capacitor, etc.) of the die 202D. The first interlayer insulator layer 560D is etched to define a trench T so that the first interlayer insulator layer 560D terminates before (e.g., approximately 4 microns away from) reaching the second and third metal layers 550D, 570D, and the second interlayer insulator layer 580D fills the trench T. Accordingly, the interface I between the first and second interlayer insulator layers 560D, 580D does not reach the metal layer 550D, 570D, which prevents moisture migration along the interface I, thereby preventing metal migration (via the interface I) when a voltage is applied. The first metal layer 530D extends over the first insulation layer 520D, and under at least a portion of the second interlayer insulator layer 580D (that fills the trench) and under the second insulation layer 540D.

Figure 6:
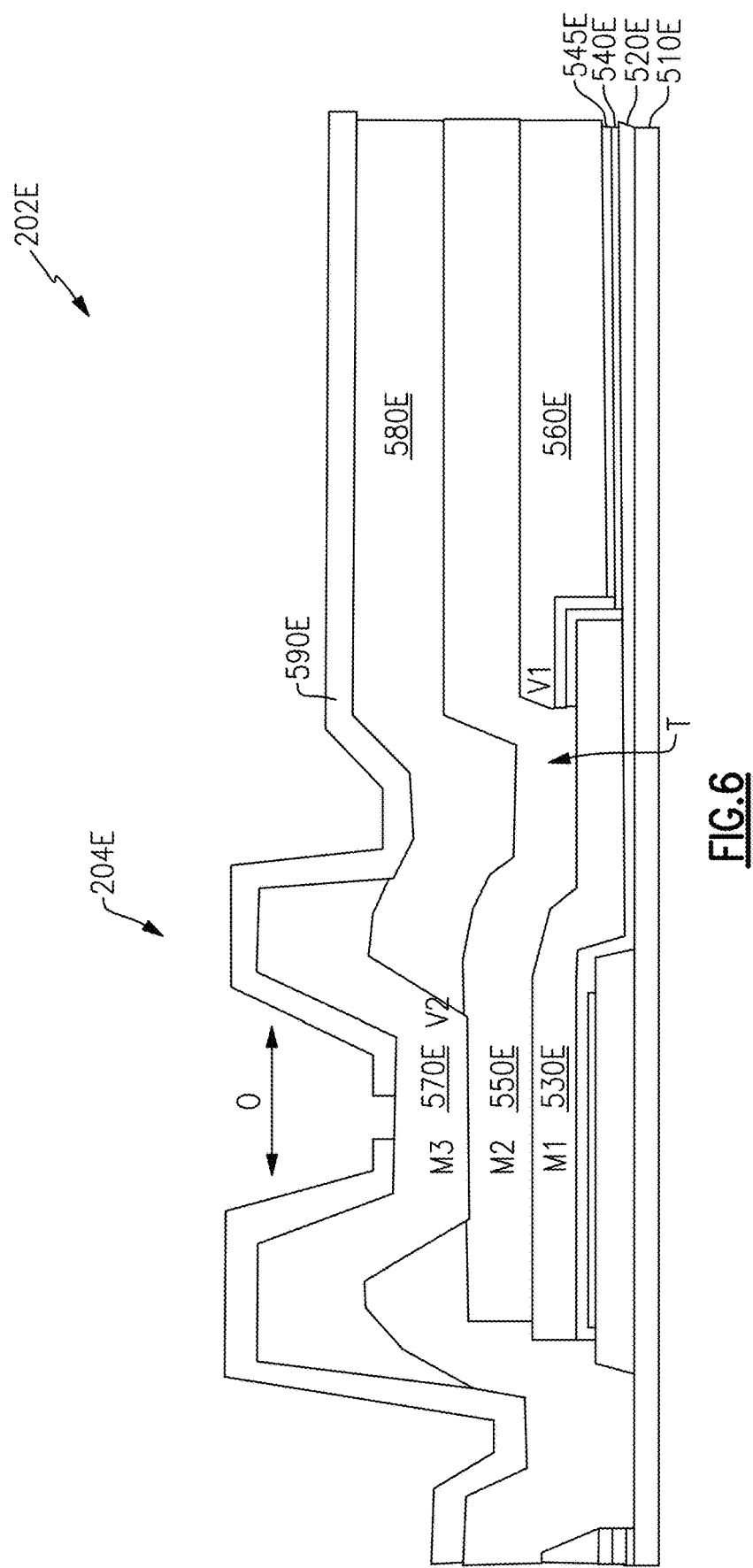
FIG. 6 is a schematic cross-sectional side view of a die having a bond pad with a moisture barrier.

FIG. 6 schematically illustrates a die 202E with a bond pad 204E. The features of the die 202E are similar to the features of the die 202D, and the features of the bond pad 204E are similar to the features of the bond pad 204D in FIG. 5. Thus, reference numerals used to designate the various components of the die 202E and bond pad 204E are similar to those used for identifying the corresponding components of the die 202D and bond pad 204D in FIG. 5, except that a "E" instead of an "D" has been added to the numerical identifier. Therefore, the structure and description for the various features of the die 202D and bond pad 204D in FIG. 5 are understood to also apply to the corresponding features of the die 202E and bond pad 204E, except as described below.

The die 202E and bond pad 204E differ from the die 202D and bond pad 204D in that the first metal layer 530E does not extend entirely across the die 202E, but is instead bounded by the first insulation layer 520E on a bottom thereof, the second and third insulation layers 540E, 545E on an end thereof and the second metal layer 550E on a top thereof. The second metal layer 550E extends across the die 202E between the first metal layer 530E and the first interlayer insulator layer 560E on a bottom thereof, and the third metal layer 570E and the second interlayer insulator layer 580E on a top thereof. The second metal layer 550E therefore allows an electrical communication between the bond pad 204E and another component (e.g., bond pad, capacitor, etc.) of the die 202E. The first interlayer insulator layer 560E is etched to define a trench T, and the second metal layer 550E fills the trench T. Additionally, because the second metal layer 550E is interposed between the first and second interlayer insulator layers 560E, 580E, there is no interface between the first and second interlayer insulator layers 560E, 580E, which prevents moisture migration, thereby preventing metal migration (via the interface) when a voltage is applied. The first metal layer 530E is shorter than the second metal layer 550E but longer than the third metal layer 570E. The second interlayer insulator layer 580E extends at least partially in between the second and third metal layers 550E, 570E.

Figure 7:
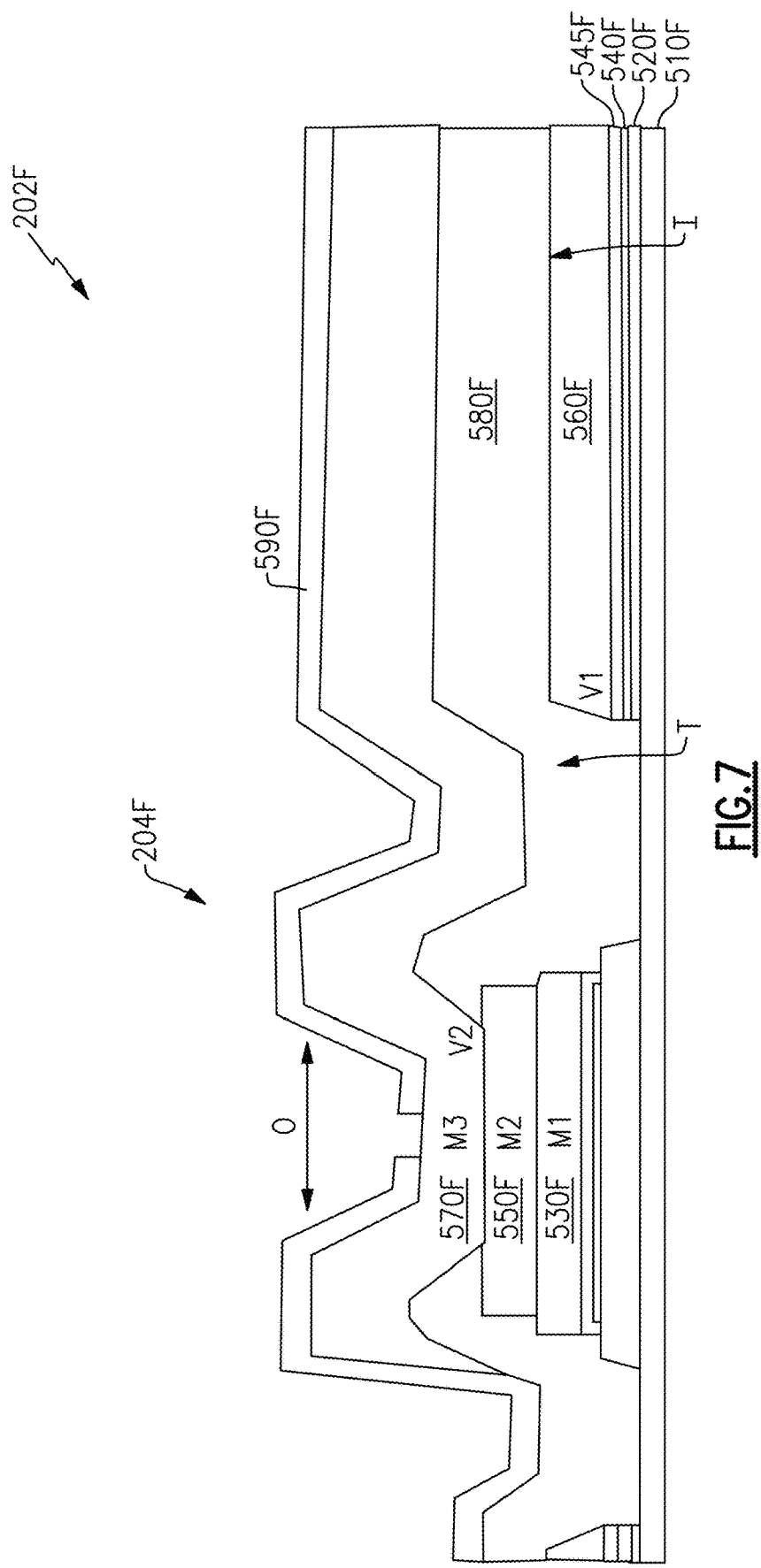
FIG. 7 is a schematic cross-sectional side view of a die having a bond pad with a moisture barrier.

FIG. 7 schematically illustrates a die 202F with a bond pad 204F. The features of the die 202F are similar to the features of the die 202C, and the features of the bond pad 204F are similar to the features of the bond pad 204C in FIG. 4. Thus, reference numerals used to designate the various components of the die 202F and bond pad 204F are similar to those used for identifying the corresponding components of the die 202C and bond pad 204C in FIG. 4, except that an "F" instead of an "C" has been added to the numerical identifier. Therefore, the structure and description for the various features of the die 202C and bond pad 204C in FIG. 4 are understood to also apply to the corresponding features of the die 202F and bond pad 204F, except as described below.

The die 202F and bond pad 204F differ from the die 202C and bond pad 204C in that the third metal layer 570E extends between the second interlayer insulator layer 280F and the topcoat insulation layer 590F and across the die 202D, thereby allowing an electrical communication between the bond pad 204F and another component (e.g., bond pad, capacitor, etc.) of the die 202F. The first interlayer insulator layer 560F is etched to define a trench T so that the first interlayer insulator layer 560F terminates before (e.g., approximately 4 microns away from) reaching the first and second metal layers 530F, 550F, and the second interlayer insulator layer 580F fills the trench T. Accordingly, the interface I between the first and second interlayer insulator layers 560F, 580F does not reach the metal layers 530F, 550F, which prevents moisture migration along the interface I, thereby preventing metal migration (via the interface I) when a voltage is applied.

Figure 8A:
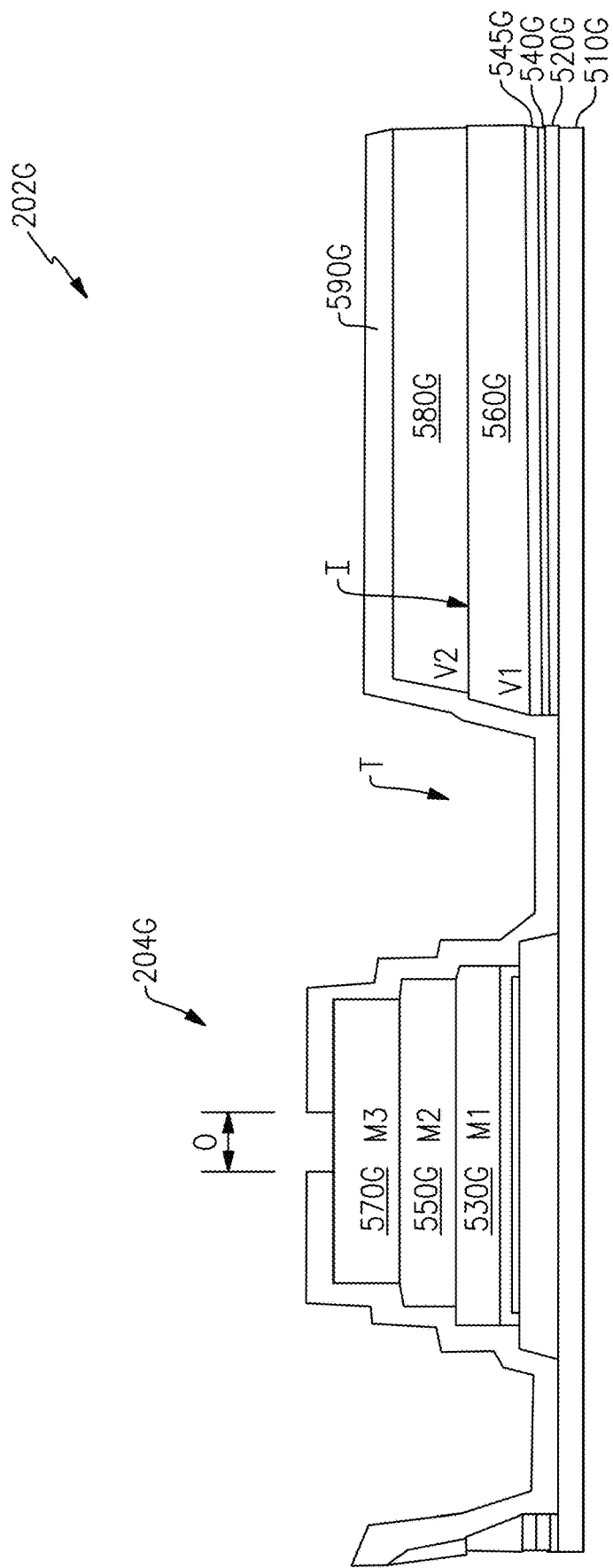
FIG. 8A is a schematic cross-sectional side view of a die having a bond pad with a moisture barrier.

FIG. 8A schematically illustrates a die 202G with a bond pad 204G. The features of the die 202G are similar to the features of the die 202F, and the features of the bond pad 204G are similar to the features of the bond pad 204F in FIG. 7. Thus, reference numerals used to designate the various components of the die 202G and bond pad 204G are similar to those used for identifying the corresponding components of the die 202F and bond pad 204F in FIG. 7, except that a "G" instead of an "F" has been added to the numerical identifier. Therefore, the structure and description for the various features of the die 202F and bond pad 204F in FIG. 7 are understood to also apply to the corresponding features of the die 202G and bond pad 204G, except as described below.

The die 202G and bond pad 204G differ from the die 202F and bond pad 204F in that the second interlayer insulator layer 580G terminates before (e.g., approximately 4 microns away from) reaching the first, second and third metal layers 530G, 550G, 570G. The first and second interlayer insulator layers 560G, 580G are etched to define a trench T and the topcoat insulation layer 590G extends into the trench T and bounds (e.g., at least partially fills the trench and bounds) the first and second interlayer insulator layers 560G, 580G apart from the metal layers 530G, 550G, 570G (e.g., which are also at least partially bounded or circumscribed by the topcoat insulation layer 590G that extends into the trench T). The topcoat insulation layer 590G provides a moisture barrier around the metal layers 530G, 550G, 570G, and around the first and second interlayer insulator layers 560G, 580G, thereby preventing moisture migration, and therefore metal migration when under a voltage, between the metal layers 530G, 550G, 570G of the bond pad 204G and the interlayer insulator layers 560G, 580G along the interface I.

With continued reference to FIG. 8A, the third metal layer 570G is shorter than the second metal layer 550G, which is shorter than the first metal layer 530G. As shown in FIG. 8A, the first, second and third insulation layers 520G, 540G, 545G are also etched to define at least a portion of the trench T, which is then bounded (e.g., at least partially filled) with the topcoat insulation layer 590G. In another implementation, only the second and third insulation layers 540G, 545G are etched. In another implementation, only the third insulation layer 545G is etched.

Figure 8B:
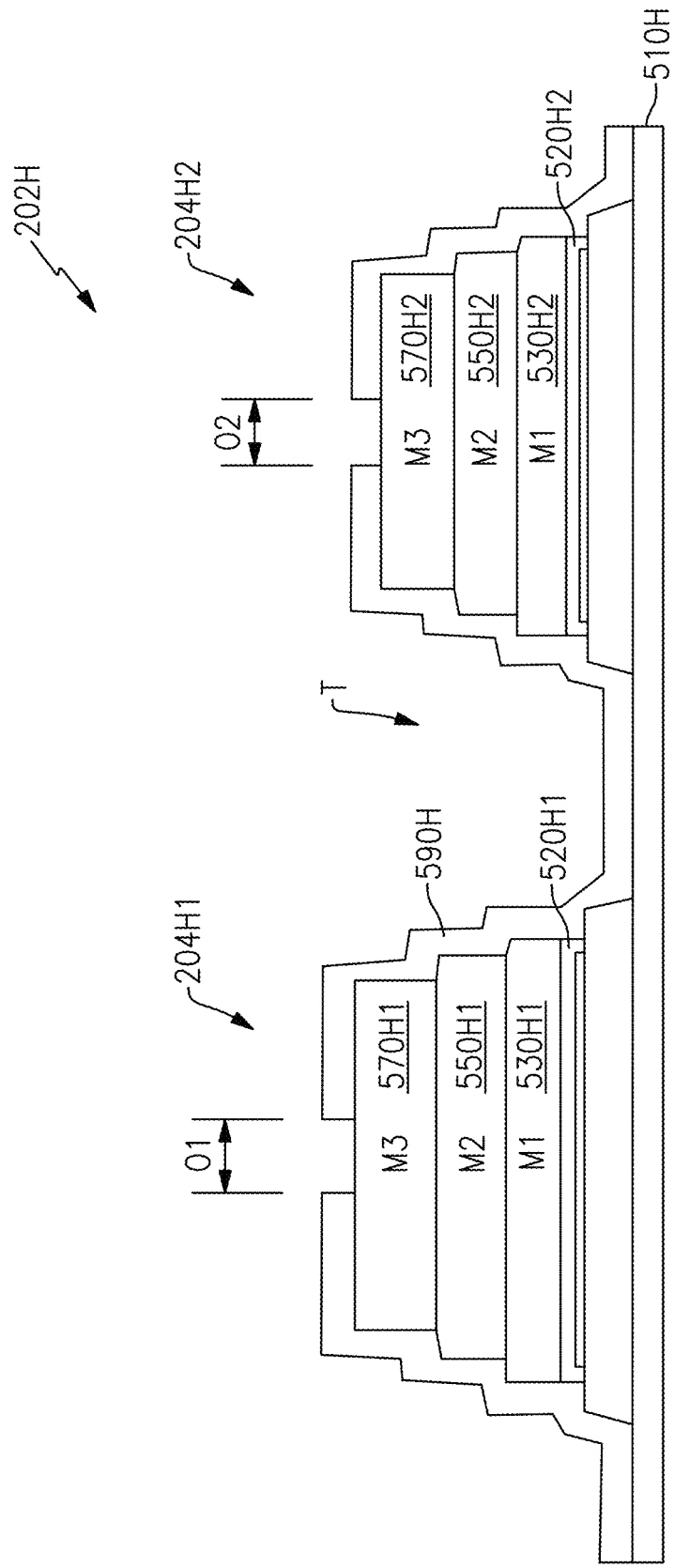
FIG. 8B is a schematic cross-sectional side view of a die having a pair of bond pads with a moisture barrier.

FIG. 8B schematically illustrates a die 202H with a first bond pad 204H1 and a second bond pad 204H2. The features of the die 202H are similar to the features of the die 202G, and the features of the bond pad(s) 204H1, 204H2 are similar to the features of the bond pad 204G in FIG. 8A. Thus, reference numerals used to designate the various components of the die 202H and bond pad(s) 204H1, 204H2 are similar to those used for identifying the corresponding components of the die 202G and bond pad 204G in FIG. 8A, except that an "H" instead of a "G" has been added to the numerical identifier. Therefore, the structure and description for the various features of the die 202G and bond pad 204G in FIG. 8A are understood to also apply to the corresponding features of the die 202H and bond pad(s) 204H1, 204H2, except as described below.

The die 202H and bond pad(s) 204H1, 204H2 differ from the die 202G and bond pad 204G in that there are two bond pad(s) 204H1, 204H2 close together (e.g., less than about 4 microns apart), each substantially identical to the bond pad 204G in FIG. 8A, and the first and second interlayer insulator layers are excluded. As shown in FIG. 8B, the trench T is defined between the bond pads 204H1, 204H2, and the topcoat insulation layer 590H extends into the trench T and bounds (e.g., at least partially fills the trench and bounds) the metal layers 530H1, 550H1, 570H1 of the first bond pad 204H1 apart from the metal layers 530H2, 550H2, 570H2 of the second bond pad 204H2 (e.g., which are also at least partially bounded or circumscribed by the topcoat insulation layer 590H that extends into the trench T). The topcoat insulation layer 590H provides a moisture barrier around the metal layers 530H1/530H2, 550H1/550H2, 570H1/570H2 of the bond pads 204H1, 204H2, thereby preventing moisture migration, and therefore metal migration when under a voltage, between bond pads 204H1, 204H2.

Figure 9:
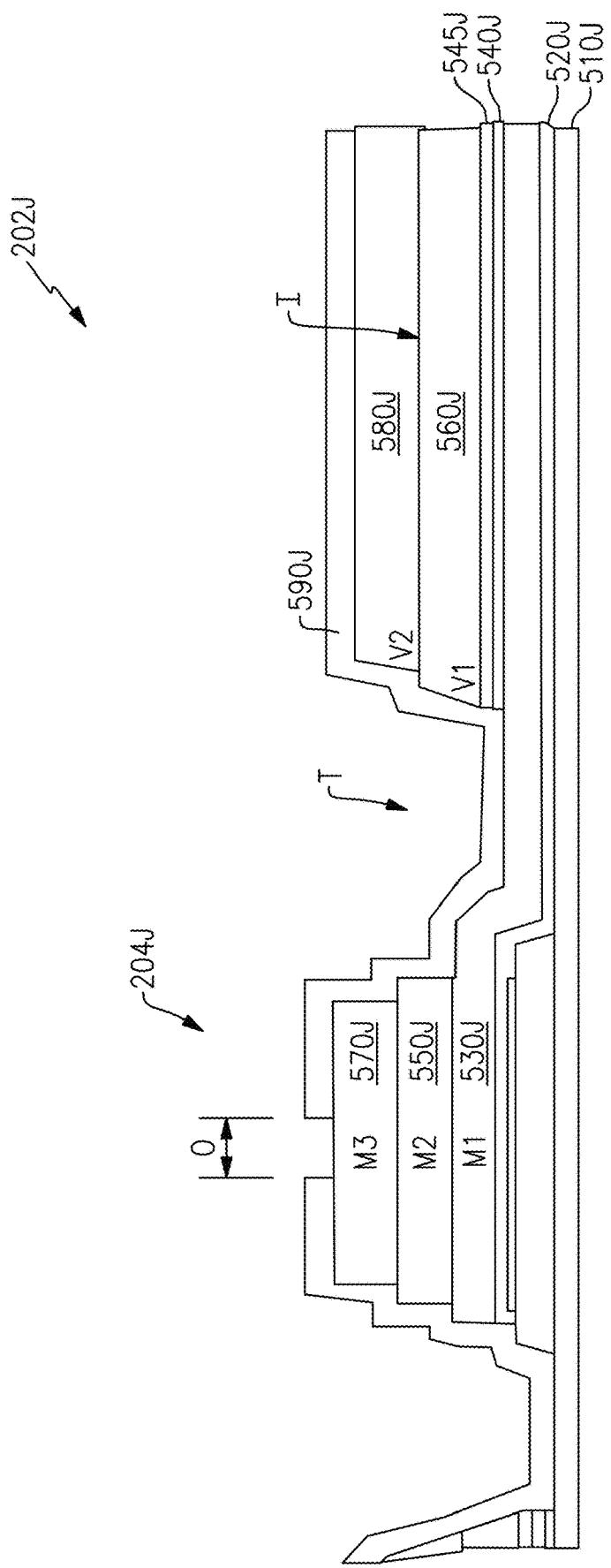
FIG. 9 is a schematic cross-sectional side view of a die having a bond pad with a moisture barrier.

FIG. 9 schematically illustrates a die 202J with a bond pad 204J. The features of the die 202J are similar to the features of the die 202G, and the features of the bond pad 204J are similar to the features of the bond pad 204G in FIG. 8A. Thus, reference numerals used to designate the various components of the die 202J and bond pad 204J are similar to those used for identifying the corresponding components of the die 202G and bond pad 204G in FIG. 8A, except that an "J" instead of a "G" has been added to the numerical identifier. Therefore, the structure and description for the various features of the die 202G and bond pad 204G in FIG. 8A are understood to also apply to the corresponding features of the die 202J and bond pad 204J, except as described below.

The die 202J and bond pad 204J differ from the die 202G and bond pad 204G in that the first metal layer 530J extends between the first insulation layer 520J and the second insulation layer 540J and across the die 202J, thereby allowing an electrical communication between the bond pad 204J and another component (e.g., bond pad, capacitor, etc.) of the die 202J. The first and second interlayer insulator layers 560J, 580J are etched to define a trench T so that the first and second interlayer insulator layers 560J, 580J terminate before (e.g., approximately 4 microns away from) reaching the second and third metal layers 550J, 570J, and the topcoat insulation layer 590J bounds the first and second interlayer insulator layers 560J, 580J away from the second and third metal layers 550J, 570J (e.g., the topcoat insulation layer 590J at least partially fills the trench T). Accordingly, the interface I between the first and second interlayer insulator layers 560J, 580J does not reach the metal layer 550J, 570J, which prevents moisture migration along the interface I, thereby preventing metal migration (via the interface I) when a voltage is applied. The first metal layer 530J extends over the first insulation layer 520J, and under at least a portion of the topcoat insulation layer 590J (that fills the trench T).

Figure 10:
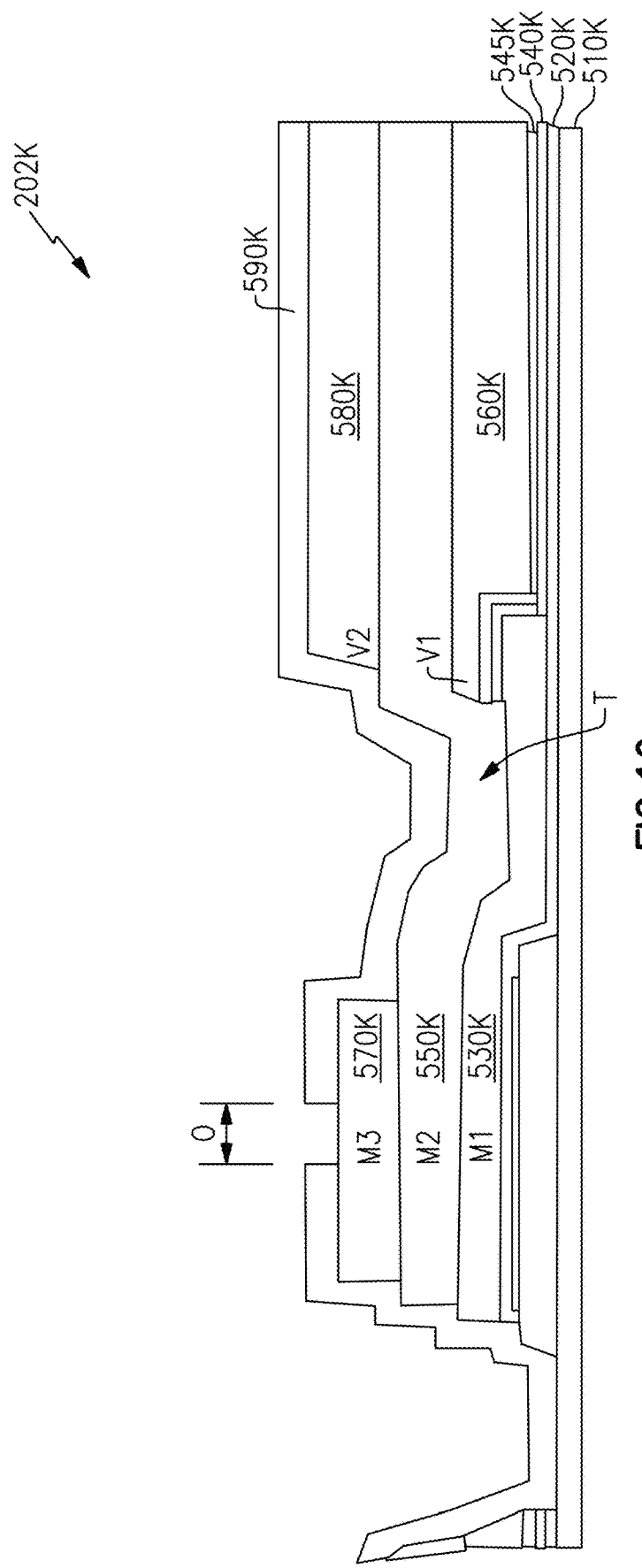
FIG. 10 is a schematic cross-sectional side view of a die having a bond pad with a moisture barrier.

FIG. 10 schematically illustrates a die 202K with a bond pad 204K. The features of the die 202K are similar to the features of the die 202J, and the features of the bond pad 204K are similar to the features of the bond pad 204J in FIG. 9. Thus, reference numerals used to designate the various components of the die 202K and bond pad 204K are similar to those used for identifying the corresponding components of the die 202J and bond pad 204J in FIG. 9, except that an "K" instead of a "J" has been added to the numerical identifier. Therefore, the structure and description for the various features of the die 202J and bond pad 204J in FIG. 9 are understood to also apply to the corresponding features of the die 202K and bond pad 204K, except as described below.

The die 202K and bond pad 204K differ from the die 202J and bond pad 204J in that the first metal layer 530K does not extend entirely across the die 202K, but is instead bounded by the first insulation layer 520K on a bottom thereof, the second and third insulation layers 540K, 545K on an end thereof and the second metal layer 550K on a top thereof. The second metal layer 550K extends across the die 202K between the first metal layer 530K and the first interlayer insulator layer 560K on a bottom thereof, and the third metal layer 570K, the topcoat insulation layer 590K and the second interlayer insulator layer 580K on a top thereof. The second metal layer 550K therefore allows an electrical communication between the bond pad 204K and another component (e.g., bond pad, capacitor, etc.) of the die 202K. The first interlayer insulator layer 560K is etched to define a trench T, and the second metal layer 550K fills the trench T. Additionally, because the second metal layer 550K is interposed between the first and second interlayer insulator layers 560K, 580K, there is no interface between the first and second interlayer insulator layers 560K, 580K, which prevents moisture migration, thereby preventing metal migration (via such an interface) when a voltage is applied. The first metal layer 530K is shorter than the second metal layer 550K but longer than the third metal layer 570K. The second interlayer insulator layer 580K is also etched and the top coat insulation layer 590K fills the etched space between the second interlayer insulator layer 580K and the third metal layer 570K.

Figure 11:
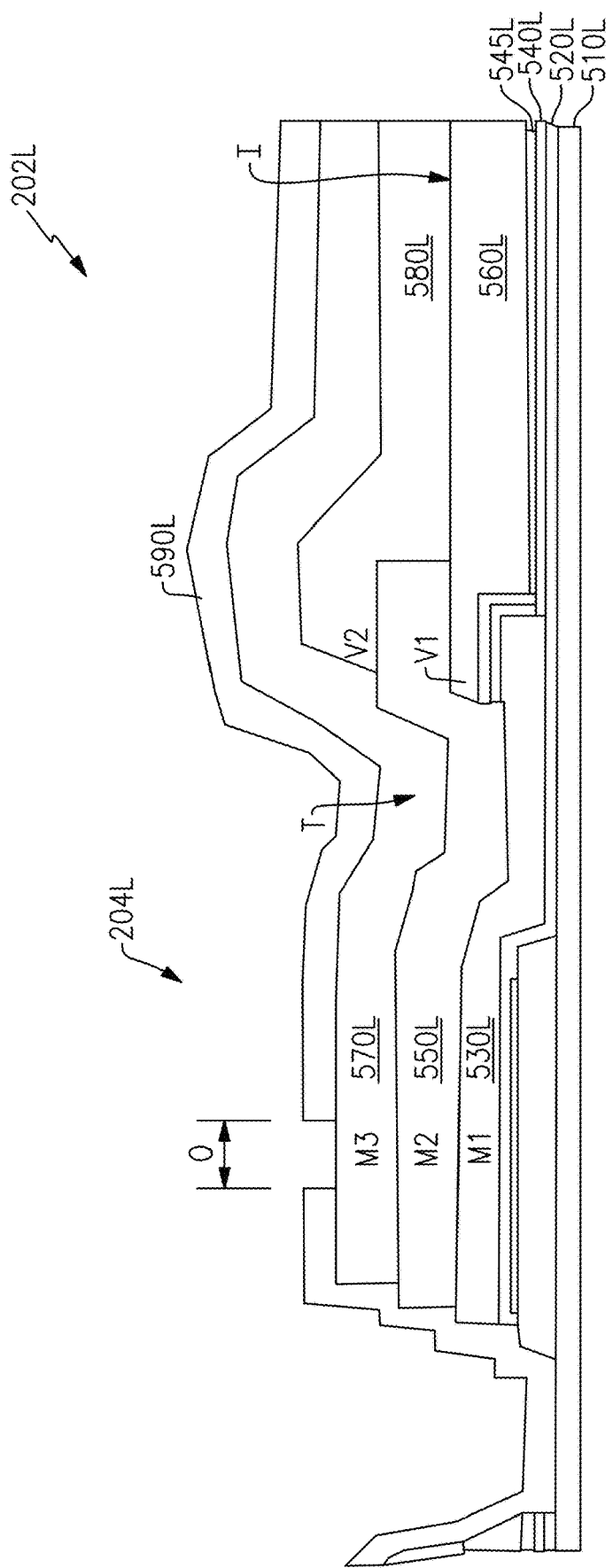
FIG. 11 is a schematic cross-sectional side view of a die having a bond pad with a moisture barrier.

FIG. 11 schematically illustrates a die 202L with a bond pad 204L. The features of the die 202L are similar to the features of the die 202K, and the features of the bond pad 204L are similar to the features of the bond pad 204K in FIG. 10. Thus, reference numerals used to designate the various components of the die 202L and bond pad 204L are similar to those used for identifying the corresponding components of the die 202K and bond pad 204K in FIG. 10, except that an "L" instead of a "K" has been added to the numerical identifier. Therefore, the structure and description for the various features of the die 202K and bond pad 204K in FIG. 10 are understood to also apply to the corresponding features of the die 202L and bond pad 204L, except as described below.

The die 202L and bond pad 204L differ from the die 202K and bond pad 204K in that the second metal layer 530L does not extend entirely across the die 202L, but is instead bounded by the first metal layer 530L and first interlayer insulator layer 560L on a bottom thereof, the second interlayer insulator layer 580L on an end thereof and the third metal layer 550L and the second interlayer insulator layer 580L on a top thereof. The third metal layer 570L extends across the die 202L between the second metal layer 550L and the second interlayer insulator layer 580L on a bottom thereof, and the topcoat insulation layer 590L on a top thereof. The third metal layer 570L therefore allows an electrical communication between the bond pad 204L and another component (e.g., bond pad, capacitor, etc.) of the die 202L. The first interlayer insulator layer 560L is etched to define a trench T, and the second metal layer 550L fills the trench T. The second interlayer insulator layer 580L is etched and the third metal layer 570L fills the etched spaced in the second interlayer insulator layer 580L and then extends over the second interlayer insulator layer 580L. Accordingly, the interface I between the first and second interlayer insulator layers 560L, 580L does not reach the third metal layer 570L, which prevents moisture migration along the interface I, thereby preventing metal migration (via the interface I) when a voltage is applied. The first metal layer 530L is shorter than the second metal layer 550L, which is shorter than the third metal layer 570L.

Method

Figure 12:
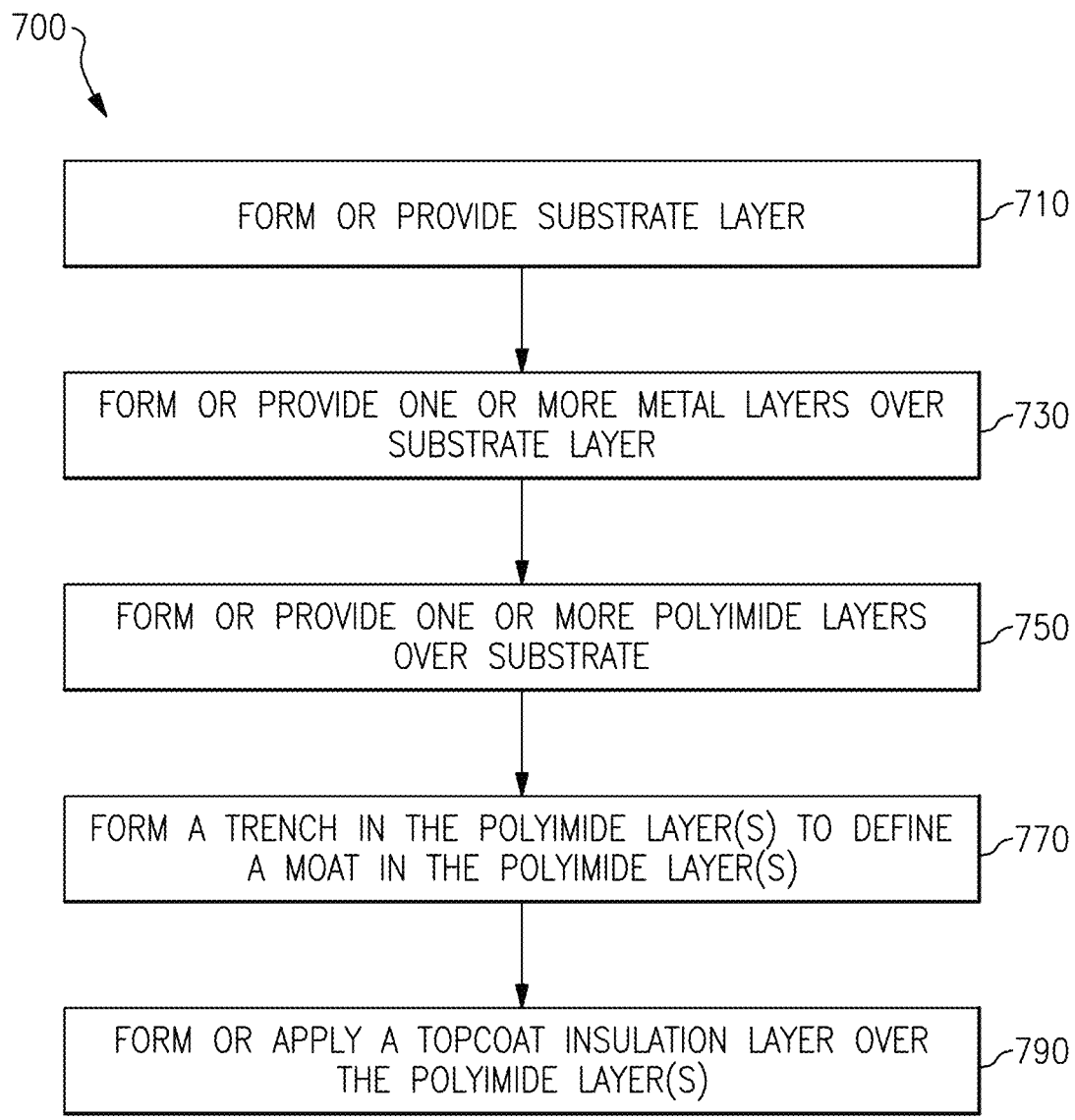
FIG. 12 is a block diagram of a method for manufacturing a die with barrier in one or more polymer layers and a bond pad with a moisture barrier.

FIG. 12 shows a method 700 of making a die with a trench in a polymer interlevel dielectric layer, such as the die 202C-202L with trench T. The method 700 includes the step of forming or providing a substrate layer 710, such as the substrate layer 510C-510L described above. The method 700 also includes the step of forming or providing one or more metal layers 730 over the substrate layer, such as the first metal layer 530C-530L, second metal layer 550C-550L, and third metal layer 570C-570L. The one or more metal layers can be deposited and patterned. Optionally, an insulation layer (e.g., silicon nitride layer) can be applied at least partially over the substrate layer, such as insulation layers 520C-520L, 540C-540L, 545C-545L. The method 700 also includes forming or applying one or more polymer interlevel dielectric layers (e.g., of polyimide) 750, such as interlayer insulator layers 560C-560L, 580C-580L. Optionally, a pair of polymer interlevel dielectric layers are applied so that they define an interface therebetween. The pair of polymer interlevel dielectric layers can be cured so that they bond (e.g., stick to each other). Optionally, one or both of the pair of polymer interlevel dielectric layers are etched to define via holes via which a metal layer can be deposited that connects with an underlying metal layer (e.g., a via hole is etched in the second polymer interlevel dielectric layer 580C-580L to deposit the third metal layer 570C-570L so that it connects with the second metal layer 550C-550L).

The method includes forming 770 a trench T in one or more of the interlayer insulator layers. Optionally, the material (e.g., polyimide) of the interlayer insulator layers is etched to form the trench. The trench can be formed in a tapered or stepped tapered manner. Advantageously, the trench in each interlayer insulator layer separates (e.g., completely separates) one side of the interlayer insulator layer from metal layer(s) of a bond pad of the die (e.g., by about 4 microns), thereby preventing an interface (e.g., the interface I) between adjacent interlayer insulator layers from extending to the metal layer(s) of the bond pad. This prevents moisture migration via the interface between the interlayer insulator layers, which thereby prevents metal migration from the bond pad via the interface when a voltage is applied, thereby preventing a short circuit. The method 700 also includes the step of forming or applying a topcoat insulation layer 790, such as topcoat insulation layer 590C-590L, over the interlayer insulator layer(s), including over the trench T. Optionally, the portion of the topcoat insulation layer that extends over the trench T in the interlayer insulator layer(s) extends to the location of a layer under the interlayer insulator layer(s), such as a metal layer, an insulation layer, or the substrate layer. The topcoat insulation layer is advantageously impervious to moisture.

Advantageously, the examples described above inhibit (e.g., prevent) short circuiting of electronic components (e.g., bond pads) due to metal migration via the interface between polymer interlevel dielectric layers caused by moisture migration into the interface in the presence of an electric field. Advantageously, this allows such a metal migration and moisture migration problem to be solved without increasing the size of the die, or add to the manufacturing cost of the die. This solution also avoids the use of oxide based processes, which can add to the cost of manufacturing, and allows low dielectric constant material (e.g., polyimide) to be used.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the systems and methods described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

Features, materials, characteristics, or groups described in conjunction with a particular aspect, embodiment, or example are to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a sub combination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some embodiments, the actual steps taken in the processes illustrated and/or disclosed may differ from those shown in the figures. Depending on the embodiment, certain of the steps described above may be removed, others may be added. Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

Of course, the foregoing description is that of certain features, aspects and advantages of the present invention, to which various changes and modifications can be made without departing from the spirit and scope of the present invention. Moreover, the semiconductor die with the moisture barrier need not feature all of the objects, advantages, features and aspects discussed above. Thus, for example, those of skill in the art will recognize that the invention can be embodied or carried out in a manner that achieves or optimizes one advantage or a group of advantages as taught herein without necessarily achieving other objects or advantages as may be taught or suggested herein. In addition, while a number of variations of the invention have been shown and described in detail, other modifications and methods of use, which are within the scope of this invention, will be readily apparent to those of skill in the art based upon this disclosure. It is contemplated that various combinations or subcombinations of these specific features and aspects of embodiments may be made and still fall within the scope of the invention. Accordingly, it should be understood that various features and aspects of the disclosed embodiments can be combined with or substituted for one another in order to form varying modes of the discussed moisture barrier in a semiconductor die.

What is claimed is:

1. A method of making a semiconductor die, the method comprising:
    forming or providing a substrate layer;
    forming or applying one or more metal layers over the substrate layer;
    forming or applying a first polymer interlevel dielectric layer over the substrate layer and forming or applying a second polymer interlevel dielectric layer over the first polymer interlevel dielectric layer to define an interface therebetween, at least a portion of the first and second polymer interlevel dielectric layers being adjacent at least one of the one or more metal layers;
    forming a trench in the one or both of the first and second polymer interlevel dielectric layers and filling the trench such that the interface between the first and second polymer interlevel dielectric layers is separated from the one or more metal layers; and
    forming or applying a topcoat insulation layer over the one or more metal layers and first and second polymer interlevel dielectric layers, the topcoat insulation layer being impervious to moisture, the trench inhibiting migration of moisture along the interface to the one or more metal layers, thereby preventing metal migration from the one or more metal layers along the interface.

2. The method of claim 1 wherein filling the trench includes filling the trench with one of: at least a portion of the topcoat insulation layer, at least a portion of one or more metal layers, and at least a portion of another of the first and second polymer interlevel dielectric layers.

3. The method of claim 1 wherein the first and second polymer interlevel dielectric layers are a first and second polyimide layers.

4. The method of claim 1 wherein the trench is formed in each of the two polymer interlevel dielectric layers in a stepped manner relative to each other.

5. The method of claim 1 wherein forming the trench includes etching one or both of the first and second polymer interlevel dielectric layers to form the trench.

6. The method of claim 1 wherein the one or more metal layers are one or more electrodes of a bond pad.

7. The method of claim 1 further comprising forming or applying one or more insulation layers at least partially over the substrate layer.

8. The method of claim 1 wherein forming the trench includes tapering the trench toward the substrate layer.

9. The method of claim 1 wherein the trench circumscribes a bond pad of the semiconductor die defined at least in part by the one or more metal layers.

10. A method of making a radiofrequency module, the method comprising:
    forming or providing a printed circuit board that includes a substrate layer;
    forming or providing a semiconductor die comprising (a) forming or providing a substrate layer, (b) forming or applying one or more metal layers over the substrate layer, (c) forming or applying a first polymer interlevel dielectric layer over the substrate layer and forming or applying a second polymer interlevel dielectric layer over the first polymer interlevel dielectric layer to define an interface therebetween, at least a portion of the first and second polymer interlevel dielectric layers being adjacent at least one of the one or more metal layers, (d) forming a trench in the one or both of the first and second polymer interlevel dielectric layers and filling the trench such that the interface between the first and second polymer interlevel dielectric layers is separated from the one or more metal layers, and (e) forming or applying a topcoat insulation layer over the one or more metal layers and first and second polymer interlevel dielectric layers, the topcoat insulation layer being impervious to moisture, the trench inhibiting migration of moisture along the interface to the one or more metal layers, thereby preventing metal migration from the one or more metal layers along the interface; and mounting the semiconductor die on the printed circuit board.

11. The method of claim 10 wherein filling the trench includes filling the trench with at least a portion of the topcoat insulation layer.

12. The method of claim 10 wherein filling the trench includes filling the trench with at least a portion of one or more metal layers.

13. The method of claim 10 wherein filling the trench includes filling the trench with at least a portion of another of the first and second polymer interlevel dielectric layers.

14. The method of claim 10 wherein the first and second polymer interlevel dielectric layers are a first and second polyimide layers.

15. The method of claim 10 wherein the trench is formed in each of the two polymer interlevel dielectric layers in a stepped manner relative to each other.

16. The method of claim 10 wherein forming the trench includes etching one or both of the first and second polymer interlevel dielectric layers to form the trench.

17. The method of claim 10 wherein the one or more metal layers are one or more electrodes of a bond pad.

18. The method of claim 10 further comprising forming or applying one or more insulation layers at least partially over the substrate layer.

19. The method of claim 10 wherein forming the trench includes tapering the trench toward the substrate layer.

20. The method of claim 10 wherein the trench circumscribes a bond pad of the semiconductor die defined at least in part by the one or more metal layers.

* * * * *